(12) United States Patent
Dubowsky

(10) Patent No.: US 7,813,825 B2
(45) Date of Patent: Oct. 12, 2010

(54) MULTIBAND DYNAMIC RANGE CONTROL GRAPHICAL INTERFACE

(75) Inventor: Jack Curtis Dubowsky, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 1105 days.

(21) Appl. No.: 11/484,526

(22) Filed: Jul. 10, 2006

(65) Prior Publication Data

US 2008/0007332 A1    Jan. 10, 2008

(51) Int. Cl.
G06F 17/00 (2006.01)
G06F 3/16 (2006.01)
G06F 3/48 (2006.01)
G06T 11/20 (2006.01)
G09G 5/00 (2006.01)
H03G 5/00 (2006.01)

(52) U.S. Cl. .......... 700/94; 345/440; 345/616; 715/727; 715/764; 715/763; 381/98

(58) Field of Classification Search .......... 700/94; 345/616, 440; 715/727, 760–765, 716; 381/98, 381/102

See application file for complete search history.

(56) References Cited

U.S. PATENT DOCUMENTS

| 5,434,954 | A | * | 7/1995 | Kawauchi et al. | ........... 345/440 |
|---|---|---|---|---|---|
| 5,617,480 | A | * | 4/1997 | Ballard et al. | ................. 381/98 |
| 6,385,322 | B1 | | 5/2002 | Mietling | |
| 6,449,642 | B2 | | 9/2002 | Bourke-Dunphy et al. | |
| 6,700,839 | B1 | | 3/2004 | Auflick et al. | |
| 6,804,565 | B2 | | 10/2004 | Eid | |
| 6,850,953 | B1 | | 2/2005 | Deshpande et al. | |
| 6,959,220 | B1 | * | 10/2005 | Wiser et al. | ................... 700/94 |
| 6,999,826 | B1 | | 2/2006 | Zhou | |
| 2002/0180803 | A1 | | 12/2002 | Kapan et al. | |
| 2003/0009247 | A1 | | 1/2003 | Wiser et al. | |
| 2003/0035555 | A1 | | 2/2003 | King et al. | |
| 2003/0174167 | A1 | | 9/2003 | Poo | |

OTHER PUBLICATIONS

Apple Computer, Inc. "Just Minutes Away From New Abilities," webpage, http://www.apple.com/macosx/upgrade/install.html.

* cited by examiner

*Primary Examiner*—Devona E Faulk
(74) *Attorney, Agent, or Firm*—Beyer Law Group LLP

(57) ABSTRACT

A graphical user interface is provided for dynamic gain control that allows a user to view and adjust multiple frequency bands and multiple controllers using a single screen in a simple and visually appealing way. Each controller within each particular frequency band may be easily modified to allow thresholds to begin at different amplitude levels for an input signal. Additionally, textual areas may be provided where the user may enter ratios, attack, and release parameters for each controller.

27 Claims, 6 Drawing Sheets

MULTIBAND DYNAMIC RANGE CONTROL GRAPHICAL INTERFACE

BACKGROUND OF THE INVENTION

1. Field of the Invention

The present invention relates to dynamic range control and, more particularly, to a graphical interface for multiband dynamic range control.

2. Description of the Related Art

Dynamic Range Control involves performing various processes on audio signals in order to affect the amplitude of the signals. Amplitude is generally measured in decibels (dBs), and modifying the amplitude of the signal acts to make the signal louder or softer, which can greatly affect both a user's audio experience as well as the perceived quality of the signal.

It is quite common to perform dynamic range control on sounds such as musical instruments. The controls to be performed on a signal can vary greatly based upon various factors, such as the quality of the speakers, the spacing and orientation of the speakers, and the probable environment in which the signals will be heard. For example, a laptop computer typically has small speakers of relatively low quality. The controls applied to signals for the laptop computer will be different than that of a system that has large speakers of high quality.

Various components in an audio system may react to various audio artifacts on certain types of signals. For example, in a certain computer system, audio signals that have an amplitude that is above the operating range of the speakers may result in an audible "buzz". Dynamic Range Control typically involves setting up various settings to be performed on the dynamic range audio signals to avoid these audio artifacts (although in certain instances dynamic range control is used to introduce desirable audio artifacts). Notably, this is a completely different process than signal equalization, which involves the alteration of the frequency response of a device. To the extent that equalization affects amplitude, it does so by altering the amplitude by a specific amount, also called the gain. Dynamic range control, on the other hand, as will be seen, involves using different controllers for different amplitude ranges to apply ratios of amplitudes of input signal to output signal, as opposed to fixed gains.

Common types of dynamic range control include compression, limiting, expansion, and gating. Compression involves reducing the dynamic range of a signal. Such action typically results in the loud parts of the signal getting quieter and the quiet parts of the signal getting louder (or at least perceived to be louder in light of the loud parts of the signal getting quieter). The compressor affects signals that are above a base threshold. Compression is typically stated as a ratio, such as 2:1, which means the input level (above the threshold) would have to increase by two decibels to create a one decibel increase in the output.

Limiting is an extreme form of compression, where the input/output relationship becomes very flat (e.g., 10:1 or higher). This essentially places a hard limit on the signal level.

Expansion and gating are similar to compression and limiting, except in the reverse. Expansion involves increasing the dynamic range of a signal so that the loud parts get louder and the quiet parts get quieter. Gating is an extreme form of expansion where a hard baseline is essentially placed on the signal. This can be beneficial in, for example, eliminating a constant, low buzzing noise in a signal.

Compression and limiting perform dynamic range control on signals above certain thresholds, whereas expansion and gating perform dynamic range control on signals below certain thresholds. These thresholds may be set by a user, as can the ratios for each of the dynamic range controls. Each type of control (e.g., compression, limiting, expansion, gating) may be referred to as a dynamic range controller. While traditionally such controllers were separate physical devices, in the digital age it is common for such controllers to be embodied in software and/or software/hardware combinations, and many distinct controllers may actually be embodied in a single piece of software.

In addition to providing different thresholds and ratios, users often find it beneficial to alter the dynamic range controllers based on the frequencies of the incoming signals. For example, it might be beneficial to provide more gating on lower frequency noises (to reducing background "rumbling") than on high frequency noises. This is known as multiband dynamic range control, as frequencies are often represented as a range, or band. For example, a user may apply a first gating ratio and threshold for a band from zero to 250 hertz (hz), and a second gating ratio and threshold for a band from 250 hz to 2000 hz.

Typically, there have been two different types of user interfaces utilized to perform dynamic range control: sliders, and input/output graphs.

Sliders are a carryover from the days when dynamic range controllers were individual pieces of hardware. FIG. 1 is a screen capture illustrating a typical slider-based dynamic range control interface. Here, a different screen may be displayed for each type of dynamic range controller. The controller in FIG. 1 is a compressor, as indicated by reference numeral 100. The various crossover points indicating the breakpoints between frequency bands may be specified using sliders 102, 104, and 106. Since there are three crossovers, there are four different frequency bands for this compressor. Thresholds may be set for each of the four bands using sliders 108, 110, 112, and 114, and compression amount may be specified using sliders 116, 118, 120, and 122.

In addition to the above-mentioned settings, it is also common to set attack and release times for the various dynamic range controllers. Attack time refers to the time delay between when the signal hits the threshold and when the controller actually begins to perform the specified range control. Release time refers to the time delay between when the signal falls below the threshold and when the controller actually begins to stop performing the specified range control. While ordinarily one might expect that it would be most beneficial to have both attack time and release time be as minimal as possible, having some amount of attack time and release time prevents the controller from causing abrupt changes, and can provide less noticeable, smoother transitions. In FIG. 1, the attack time and release time can be specified using sliders 124 and 126. There are other various settings, such as equalization settings, that can be controlled by sliders depicted in FIG. 1, but these are outside the scope of this document and will therefore not be discussed.

The other typical type of dynamic range control user interface is an input/output graph. As example of such a graph is depicted in FIG. 2. Here, output amplitude level is displayed on the vertical axis 200 and input amplitude level is displayed on the horizontal axis 202. This represents the change in input level for a particular dynamic range controller. FIG. 2 depicts a compressor, and as such at a certain threshold 204, the curve changes from a slope of 1 (unaltered amplitude) to a lower slope. For example, 2:1 compression 206 is depicted in FIG. 2 starting at the threshold 204. If the controller had been a limiter, the slope would have been even lower, approaching a flat horizontal, given the high ratio of input level to output level characteristic of limiters.

These typical user interfaces, however, suffer from various disadvantages. The user is not able to see all the dynamic range controller information on one screen. When using sliders, the sliders only depict the settings for a single controller at a time. Likewise, the input/output graph only depicts the settings for a single controller at a time. The input/output graph additionally suffers from the fact that it displays only a single frequency band at a time. Furthermore, the text-based nature of the sliders makes it difficult for users to visualize and adjust the settings of the controllers.

What is needed is a user interface for dynamic range controller that is easy and intuitive for a user and provides information on all controllers and all frequency bands in a single screen.

SUMMARY OF THE INVENTION

A graphical user interface is provided for dynamic gain control that allows a user to view and adjust multiple frequency bands and multiple controllers using a single screen in a simple and visually appealing way. Each controller within each particular frequency band may be easily modified to allow thresholds to begin at different amplitude levels for an input signal. Additionally, textual areas may be provided where the user may enter ratios, attack, and release parameters for each controller.

BRIEF DESCRIPTION OF THE DRAWINGS

The invention will be readily understood by the following detailed description in conjunction with the accompanying drawings, wherein like reference numerals designate like structural elements, and in which.

DESCRIPTION OF THE INVENTION

A graphical user interface is provided for dynamic gain control that allows a user to view and adjust multiple frequency bands and multiple controllers using a single screen in a simple and visually appealing way. Each controller within each particular frequency band may be easily modified to allow thresholds to begin at different amplitude levels for an input signal. Additionally, textual areas may be provided where the user may enter ratios, attack, and release parameters for each controller.

Figure 1:
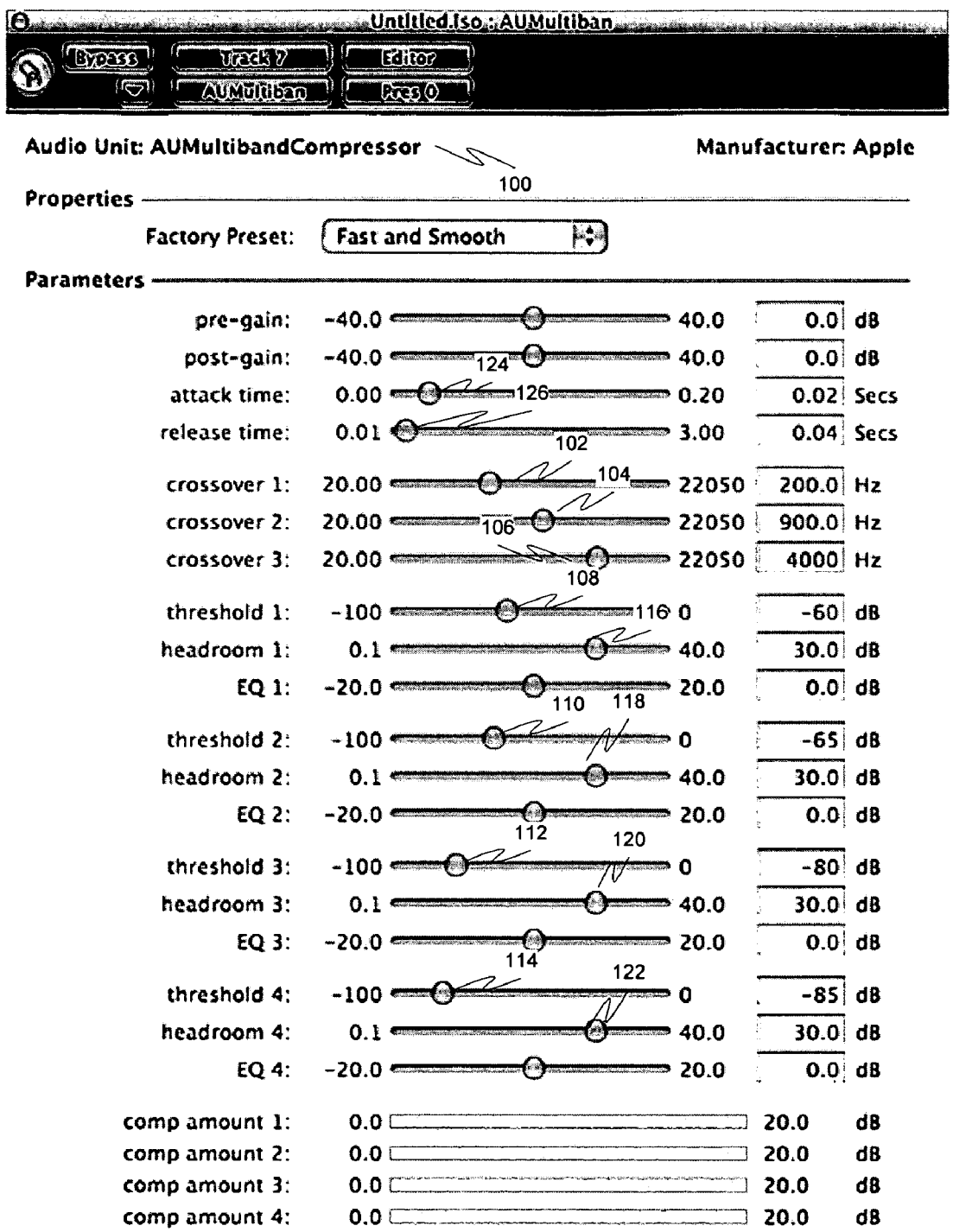
FIG. 1 is a screen capture illustrating a typical slider-based dynamic range control interface.
Figure 2:
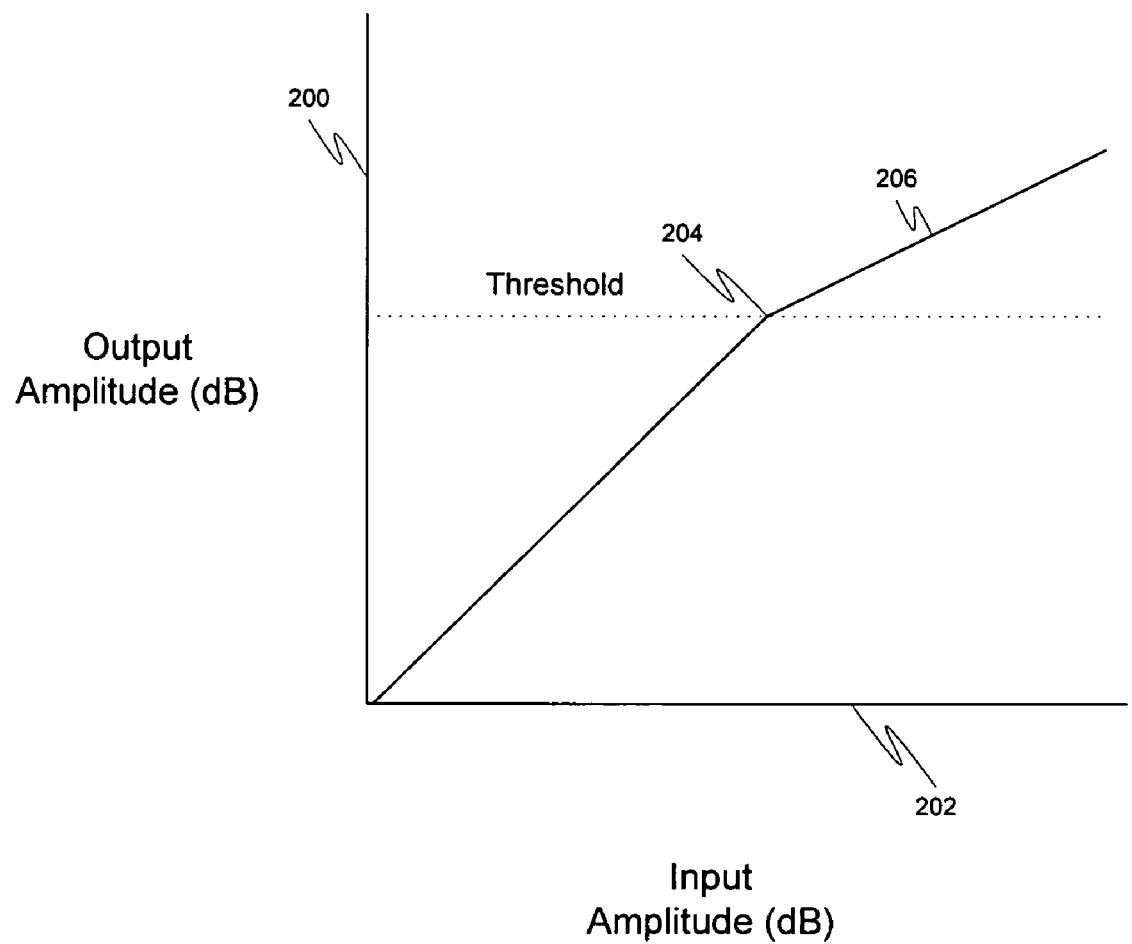
FIG. 2 is an example of a typical input/output graph used for dynamic range control.
Figure 3:
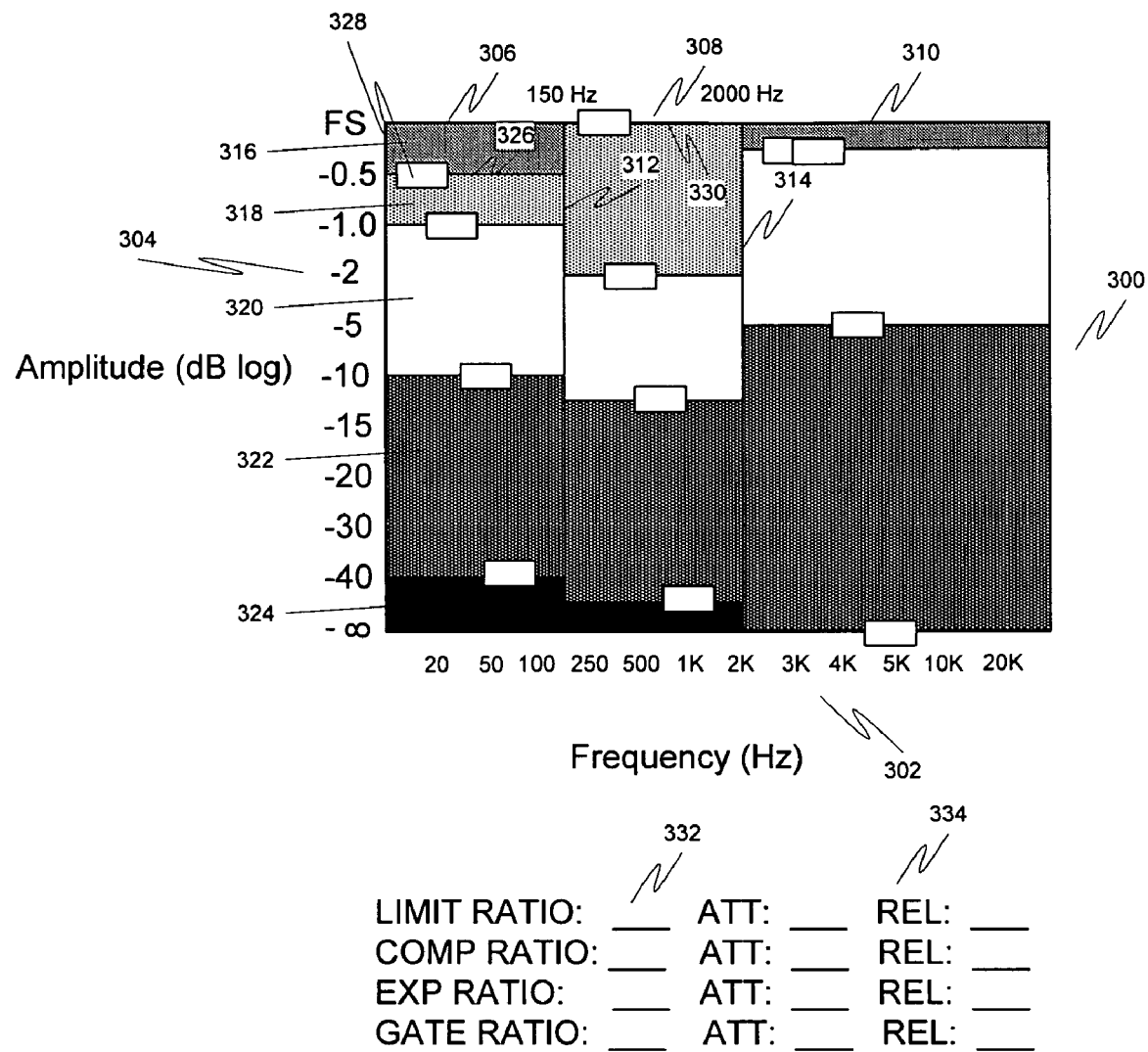
FIG. 3 is a diagram illustrating a dynamic range control user interface in accordance with an embodiment of the present invention.

FIG. 3 is a diagram illustrating a dynamic range control user interface in accordance with an embodiment of the present invention. A main rectangle 300 may be displayed on a display. The main rectangle may have frequency numbers along a horizontal side 302 and amplitude numbers along a vertical side 304. The frequency numbers may be represented in, for example, Hz, and the amplitude may be represented in dB on a logarithmic scale. FS, or full scale, which is the maximum amplitude for the signal in the system, may be represented at the top of the vertical side 304.

The main rectangle 300 may be divided into a plurality of frequency band rectangles 306, 308, 310. Each of these rectangles represents a different range of frequencies at which to apply various dynamic range controllers. These frequency band rectangles may each be separated by a line 312, 314 that is movable horizontally by the user to adjust the corresponding frequency at which the frequency bands are divided. For example, line 312 is depicted at 150 Hz, which divides frequency band rectangle 306, which represents frequencies between 0 Hz and 150 Hz, and frequency band rectangle 308, which represents frequencies between 150 Hz and 2000 Hz. The line 312 may be movable by, for example, the user moving a mouse cursor over the line 312, clicking, and dragging it horizontally to the appropriate location. This allows the user to easily adjust the various frequency bands. Additional frequency band rectangles can be added to the main rectangle 300 by, for example, the user typing a specific command, or selecting a specific menu item. This allows the user to view and modify an unlimited number of frequency bands on a single screen.

Each frequency band rectangle may be divided into a plurality of controller rectangles. For example, frequency band rectangle 306 is divided into five different controller rectangles 316, 318, 320, 322, 324. Each of these controller rectangles represents a different dynamic range controller. These controller rectangles may each be separated by a line 326, 328, 330, 332 that is movable vertically by the user to adjust the threshold for the corresponding controller. For example, controller rectangle 316 may represent a limiter, controller rectangle 318 may represent a compressor, controller rectangle 320 may represent no alteration, or the lack of a controller, controller rectangle 322 may represent an expander, and controller rectangle 324 may represent a gate. In an embodiment of the present invention, each controller rectangle within a frequency band is displayed using a separate fill pattern or color to represent a particular controller type. For example, a limiter may be represented using red, a compressor using yellow, no alteration using white, etc. The line 326 may be movable by, for example, the user moving a mouse cursor over a button 328 on the line 326, clicking, and dragging it vertically to the appropriate location. This allows the user to easily adjust the various thresholds for the various controller types. Additional controller rectangles can be added to each frequency band rectangle by, for example, the user typing a specific command, or selecting a specific menu item. This allows the user to view and modify an unlimited number of controller thresholds for each frequency band, permitting the user to control an unlimited number of frequency band/controller combinations on a single screen.

Each of the controller rectangles may be completely collapsible, meaning that that the dividing line between, for example, a first controller rectangle and a second controller rectangle may be moved so that it overlaps the dividing line between the second controller rectangle and third controller rectangle, effectively eliminating the second controller rectangle for that frequency band. The same logic applies to eliminating a first controller rectangle by moving the divider between the first controller rectangle and the second controller rectangle to overlap the end line of the first controller rectangle. This is represented in FIG. 3 in the second frequency rectangle 308, where dividing line 330, which would ordinarily divide a controller rectangle for a limiter and a controller rectangle for a compressor, has been moved to overlap the end line of the controller rectangle for the limiter, thus effectively removing the limiter from this frequency band.

An area may be provided for the user to enter various other settings related to the dynamic rang control. For example, area 342 allows the user to enter a ratio for each controller, and area 344 allows the user to enter attack and release times for each controller.

Figure 4:
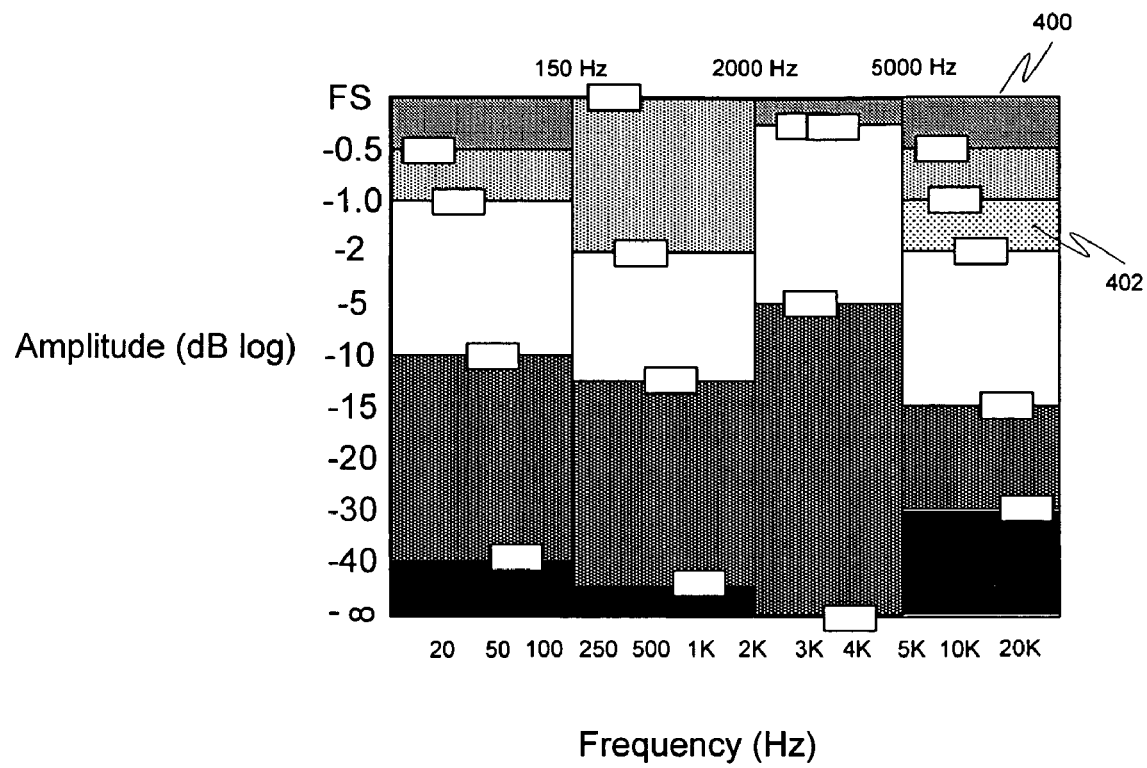
FIG. 4 is a diagram illustrating a dynamic range control user interface in accordance with another embodiment of the present invention.

FIG. 4 is a diagram illustrating a dynamic range control user interface in accordance with another embodiment of the present invention. This diagram is similar to FIG. 3, except that here the user has added a fourth frequency band 400, and the user has added a sixth controller rectangle 402 to the fourth frequency band 400. The sixth controller rectangle 402 may be, for example, a second compressor set at a different ratio than the first compressor.

Figure 5:
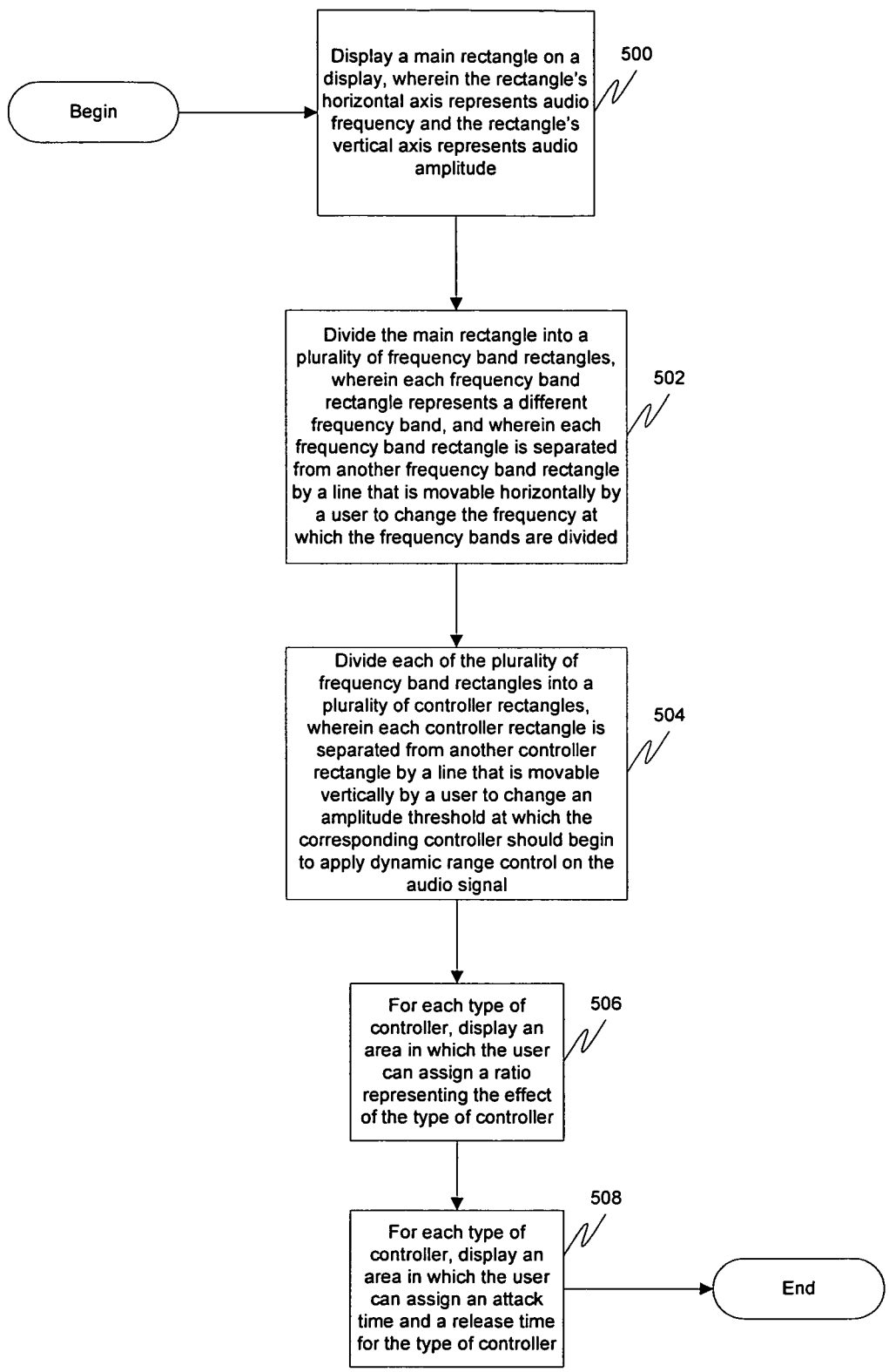
FIG. 5 is a flow diagram illustrating a method for providing a graphical interface for dynamic range control of an audio signal in accordance with an embodiment of the present invention.

FIG. 5 is a flow diagram illustrating a method for providing a graphical interface for dynamic range control of an audio signal in accordance with an embodiment of the present invention. At 500, a main rectangle may be displayed on a display, wherein the rectangle's horizontal axis represents audio frequency and the rectangle's vertical axis represents audio amplitude. The audio amplitude may be represented in decibels in a logarithmic scale displayed on the vertical of the main rectangle. The audio frequency may be represented in hertz on a scale displayed on a horizontal of the main rectangle. At 502, the main rectangle may be divided into a plurality of frequency band rectangles, wherein each frequency band rectangle represents a different frequency band, and wherein each frequency band rectangle is separated from another frequency band rectangle by a line that is movable horizontally by a user to change the frequency at which the frequency bands are divided. At 504, each of the plurality of frequency band rectangles may be divided into a plurality of controller rectangles, wherein each controller rectangle represents a different dynamic range controller to be applied for a particular frequency band, and wherein each controller rectangle is separated from another controller rectangle by a line that is movable vertically by a user to change an amplitude threshold at which the corresponding controller should begin to apply dynamic range control on the audio signal. Each controller rectangle within a frequency band rectangle may be displayed using a different color, wherein the color of the controller rectangle represents the type of controller corresponding to the controller rectangle. At 506, for each type of controller, an area in which the user can assign a ratio representing the effect of the type of controller may be displayed. At 508, for each type of controller, an area in which the user can assign an attack time and a release time for the type of controller may be displayed.

Figure 6:
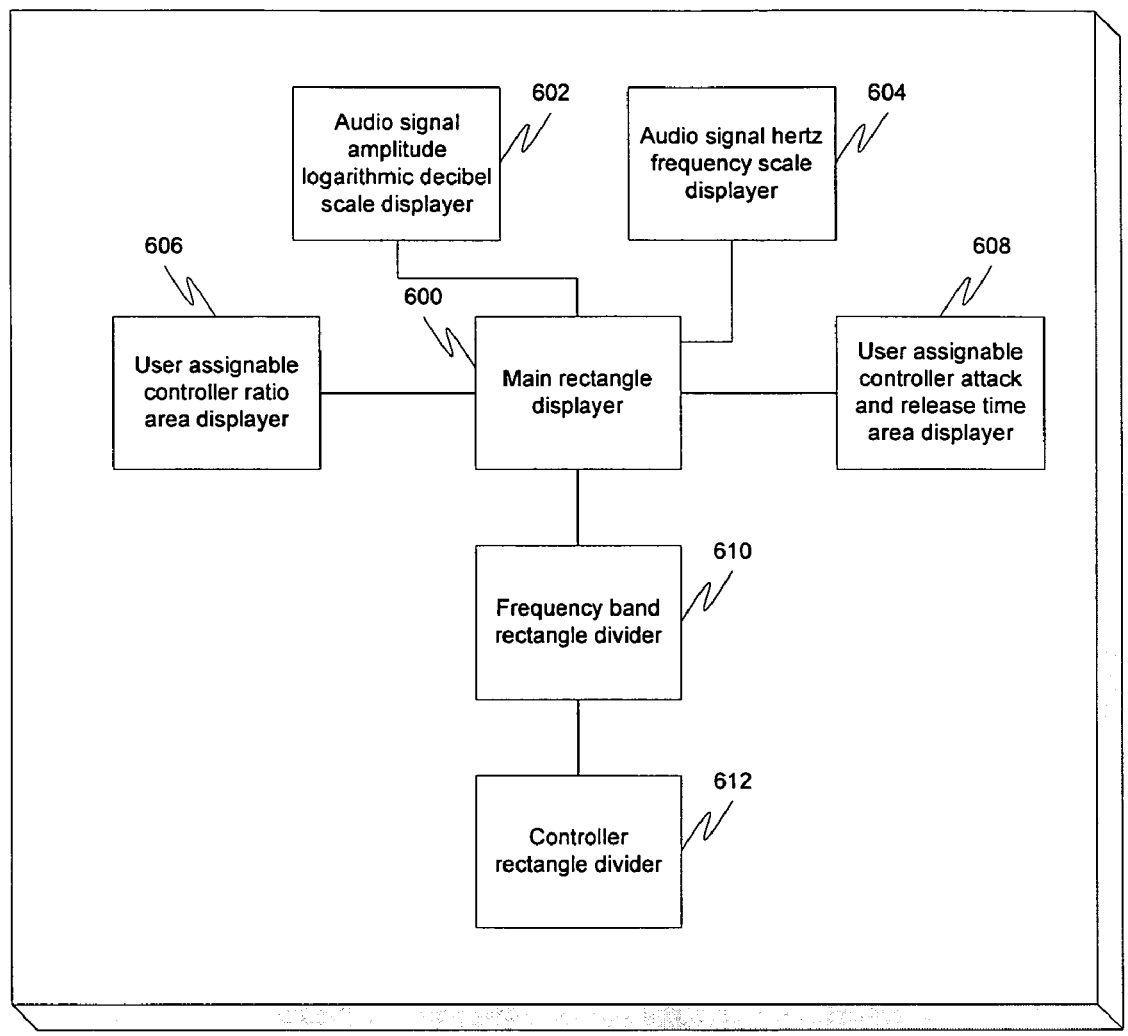
FIG. 6 is a block diagram illustrating a graphical interface for dynamic range control of an audio signal in accordance with an embodiment of the present invention.

FIG. 6 is a block diagram illustrating a graphical interface for dynamic range control of an audio signal in accordance with an embodiment of the present invention. A main rectangle displayer 600 may display a main rectangle on a display, wherein the rectangle's horizontal axis represents audio frequency and the rectangle's vertical axis represents audio amplitude. The audio amplitude may be represented in decibels in a logarithmic scale displayed on the vertical of the main rectangle using an audio signal amplitude logarithmic decibel scale displayer 602 coupled to the main rectangle displayer 600. The audio frequency may be represented in hertz on a scale displayed on a horizontal of the main rectangle using an audio signal hertz frequency scale displayer 604 coupled to the main rectangle displayer 600. A frequency band rectangle divider 606 coupled to the main rectangle displayer 600 may divide the main rectangle into a plurality of frequency band rectangles, wherein each frequency band rectangle represents a different frequency band, and wherein each frequency band rectangle is separated from another frequency band rectangle by a line that is movable horizontally by a user to change the frequency at which the frequency bands are divided. A controller rectangle divider 608 coupled to the frequency band rectangle divider 606 may divide each of the plurality of frequency band rectangles into a plurality of controller rectangles, wherein each controller rectangle represents a different dynamic range controller to be applied for a particular frequency band, and wherein each controller rectangle is separated from another controller rectangle by a line that is movable vertically by a user to change an amplitude threshold at which the corresponding controller should begin to apply dynamic range control on the audio signal. Each controller rectangle within a frequency band rectangle may be displayed using a different color, wherein the color of the controller rectangle represents the type of controller corresponding to the controller rectangle. A user assignable controller ratio area displayer 610 coupled to the main rectangle displayer 600 may, for each type of controller, display an area in which the user can assign a ratio representing the effect of the type of controller. A user assignable controller attack and release time area displayer 612 may, for each type of controller, display an area in which the user can assign an attack time and a release time for the type of controller.

The various aspects, embodiments, implementations or features of the invention can be used separately or in any combination.

The invention is preferably implemented by software, but can also be implemented in hardware or a combination of hardware and software. Each element or step may be implemented in hardware, software, or a combination thereof. The invention can also be embodied as computer readable code on a computer readable medium. The computer readable medium is any data storage device that can store ]0 data, which can thereafter be read by a computer system. Examples of the computer readable medium include read-only memory, random-access memory, CD-ROMs, DVDs, magnetic tape and optical data storage devices. The computer readable medium can also be distributed over network-coupled computer systems so that the computer readable code is stored and executed in a distributed fashion.

The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. A method for providing a graphical interface for dynamic range control of an audio signal, the method comprising:
displaying a main rectangle on a display, wherein the rectangle's horizontal axis represents audio frequency and the rectangle's vertical axis represents audio amplitude;
dividing the main rectangle into a plurality of frequency band rectangles, wherein each frequency band rectangle represents a different frequency band, and wherein each frequency band rectangle is separated from another frequency band rectangle by a line that is movable horizontally by a user to change the frequency at which the frequency bands are divided; and dividing each of the plurality of frequency band rectangles into a plurality of controller rectangles, wherein each controller rectangle represents a different dynamic range controller to be applied for a particular frequency band, and wherein each controller rectangle is separated from another controller rectangle by a line that is movable vertically by a user to change an amplitude threshold at which the corresponding controller should begin to apply dynamic range control on the audio signal.

2. The method of claim 1, wherein the audio amplitude is represented in decibels in a logarithmic scale displayed on a vertical of the main rectangle.

3. The method of claim 1, wherein the audio frequency is represented in hertz on a scale displayed on a horizontal of the main rectangle.

4. The method of claim 1, wherein each controller rectangle within a frequency band rectangle is displayed using a different color, wherein the color of the controller rectangle represents the type of controller corresponding to the controller rectangle.

5. The method of claim 1, further comprising:
for each type of controller, displaying an area in which the user can assign a ratio representing the effect of the type of controller.

6. The method of claim 1, further comprising:
for each type of controller, displaying an area in which the user can assign an attack time and a release time for the type of controller.

7. A graphical interface for dynamic range control of an audio signal, the graphical interface comprising:
a main rectangle displayer configured to display a main rectangle on a display, wherein the rectangle's horizontal axis represents audio frequency and the rectangle's vertical axis represents audio amplitude;
a frequency band rectangle divider coupled to said main rectangle displayer and configured to divide the main rectangle into a plurality of frequency band rectangles, wherein each frequency band rectangle represents a different frequency band, and wherein each frequency band rectangle is separated from another frequency band rectangle by a line that is movable horizontally by a user to change the frequency at which the frequency bands are divided; and
a controller rectangle divider coupled to said frequency band rectangle divider and configured to divide each of the plurality of frequency band rectangles into a plurality of controller rectangles, wherein each controller rectangle represents a different dynamic range controller to be applied for a particular frequency band, and wherein each controller rectangle is separated from another controller rectangle by a line that is movable vertically by a user to change an amplitude threshold at which the corresponding controller should begin to apply dynamic range control on the audio signal.

8. The graphical interface of claim 7, further comprising:
an audio amplitude logarithmic decibel scale displayer coupled to said main rectangle displayer.

9. The graphical interface of claim 7, further comprising:
an audio hertz frequency scale displayer coupled to said main rectangle displayer.

10. The graphical interface of claim 7, further comprising:
a user assignable controller ratio area displayer coupled to said main rectangle displayer.

11. The graphical interface of claim 7, further comprising:
a user assignable controller attack and release time area displayer coupled to said main rectangle displayer.

12. An apparatus for providing a graphical interface for dynamic range control of an audio signal, the apparatus comprising:
means for displaying a main rectangle on a display, wherein the rectangle's horizontal axis represents audio frequency and the rectangle's vertical axis represents audio amplitude;
means for dividing the main rectangle into a plurality of frequency band rectangles, wherein each frequency band rectangle represents a different frequency band, and wherein each frequency band rectangle is separated from another frequency band rectangle by a line that is movable horizontally by a user to change the frequency at which the frequency bands are divided; and
means for dividing each of the plurality of frequency band rectangles into a plurality of controller rectangles, wherein each controller rectangle represents a different dynamic range controller to be applied for a particular frequency band, and wherein each controller rectangle is separated from another controller rectangle by a line that is movable vertically by a user to change an amplitude threshold at which the corresponding controller should begin to apply dynamic range control on the audio signal.

13. The apparatus of claim 12, wherein the audio amplitude is represented in decibels in a logarithmic scale displayed on a vertical of the main rectangle.

14. The apparatus of claim 12, wherein the audio frequency is represented in hertz on a scale displayed on a horizontal of the main rectangle.

15. The apparatus of claim 12, wherein each controller rectangle within a frequency band rectangle is displayed using a different color, wherein the color of the controller rectangle represents the type of controller corresponding to the controller rectangle.

16. The apparatus of claim 12, further comprising:
for each type of controller, means for displaying an area in which the user can assign a ratio representing the effect of the type of controller.

17. The apparatus of claim 12, further comprising:
for each type of controller, means for displaying an area in which the user can assign an attack time and a release time for the type of controller.

18. A computer readable medium readable by a computer system, the computer readable medium tangibly embodying a program of instructions executable by the computer system to perform a method for providing a graphical interface for dynamic range control of an audio signal, the method comprising:
displaying a main rectangle on a display, wherein the rectangle's horizontal axis represents audio frequency and the rectangle's vertical axis represents audio 20 amplitude;
dividing the main rectangle into a plurality of frequency band rectangles, wherein each frequency band rectangle represents a different frequency band, and wherein each frequency band rectangle is separated from another frequency band rectangle by a line that is movable horizontally by a user to change the frequency at 25 which the frequency bands are divided; and
dividing each of the plurality of frequency band rectangles into a plurality of controller rectangles, wherein each controller rectangle represents a different dynamic range controller to be applied for a particular frequency band, and wherein each controller rectangle is separated from another controller rectangle by a line that 30 is movable vertically by a user to change an amplitude threshold at which the corresponding controller should begin to apply dynamic range control on the audio signal.

19. The program storage device of claim 18, wherein the audio amplitude is represented in decibels in a logarithmic scale displayed on a vertical of the main rectangle.

20. The program storage device of claim 18, wherein the audio frequency is represented in hertz on a scale displayed on a horizontal of the main rectangle.

21. The program storage device of claim 18, wherein each controller rectangle within a frequency band rectangle is displayed using a different color, wherein the color of the controller rectangle represents the type of controller corresponding to the controller rectangle.

22. The program storage device of claim 18, wherein the method further comprises:
   for each type of controller, displaying an area in which the user can assign a ratio representing the effect of the type of controller.

23. The program storage device of claim 18, wherein the method further comprises:
   for each type of controller, displaying an area in which the user can assign an attack time and a release time for the type of controller.

24. A method for providing a graphical interface for dynamic range control of an audio signal, the method comprising:
   displaying a main rectangle on a display, wherein the rectangle's horizontal axis represents audio frequency and the rectangle's vertical axis represents audio amplitude;
   dividing the main rectangle into a plurality of frequency band rectangles, wherein each frequency band rectangle represents a different frequency band, and wherein each frequency band rectangle is separated from another frequency band rectangle by a line that is movable horizontally by a user to change the frequency at which the frequency bands are divided;
   dividing each of the plurality of frequency band rectangles into a plurality of controller rectangles, wherein each controller rectangle represents a different dynamic range controller to be applied for a particular frequency band, and wherein each controller rectangle is separated from another controller rectangle by a line that is movable vertically by a user to change an amplitude threshold at which the corresponding controller should begin to apply dynamic range control on the audio signal;
   displaying the divided main rectangle with divided frequency band rectangles on the display; and
   outputting an audio signal based upon the amplitude thresholds in the frequency band rectangles and the lines separating frequency band rectangles.

25. The method of claim 24, wherein the outputting includes applying an amplitude identified in a particular frequency band rectangle to a frequency range identified by lines separating the particular frequency band rectangle from other frequency band rectangles.

26. The method of claim 24, wherein each controller rectangle within a frequency band rectangle is displayed using a different color, wherein the color of the controller rectangle represents the type of controller corresponding to the controller rectangle.

27. The method of claim 24, further comprising:
   for each type of controller, displaying an area in which the user can assign an attack time and a release time for the type of controller.

* * * * *

UNITED STATES PATENT AND TRADEMARK OFFICE
CERTIFICATE OF CORRECTION

| | | |
|---|---|---|
| PATENT NO. | : 7,813,825 B2 | Page 1 of 1 |
| APPLICATION NO. | : 11/484526 | |
| DATED | : October 12, 2010 | |
| INVENTOR(S) | : Jack Curtis Dubowsky | |

It is certified that error appears in the above-identified patent and that said Letters Patent is hereby corrected as shown below:

In column 6, line 36, after "store" delete "]0".

In column 8, line 52, in Claim 18, after "audio" delete "20".

In column 8, line 59, in Claim 18, after "at" delete "25".

In column 8, line 66, in Claim 18, after "that" delete "30".

Signed and Sealed this

Thirteenth Day of December, 2011

David J. Kappos
*Director of the United States Patent and Trademark Office*